United States Patent [19]
Schwartz

[11] 3,767,942
[45] Oct. 23, 1973

[54] SOLID STATE RELAY

[75] Inventor: Norman Larry Schwartz, Stony Brook, N.Y.

[73] Assignee: Multiplex Communications Inc., Hauppauge, N.Y.

[22] Filed: Mar. 10, 1971

[21] Appl. No.: 122,701

[52] U.S. Cl. .................. 307/257, 307/210, 307/251
[51] Int. Cl. .................. H03k 17/00
[58] Field of Search .................. 307/210, 251, 314, 307/257, 279

[56] References Cited

UNITED STATES PATENTS

| | | | |
|---|---|---|---|
| 3,023,321 | 2/1962 | Isabeau | 307/301 |
| 3,473,054 | 10/1969 | Wieczorek | 307/251 |
| 3,488,520 | 1/1970 | Hunter | 307/251 |
| 3,495,097 | 2/1970 | Abramson et al. | 307/251 |
| 3,492,505 | 1/1970 | Entenmann | 307/251 X |
| 3,210,570 | 10/1965 | Brock et al. | 307/210 |
| 3,041,475 | 6/1962 | Fisher, Jr. | 307/210 |

*Primary Examiner*—John W. Huckert
*Assistant Examiner*—B. P. Davis
*Attorney*—Sandoe, Hopgood & Calimafde

[57] ABSTRACT

A solid state relay structure includes electrically isolated control and plural output switch ports. The arrangement can provide any desired switch configuration, wherein the individual switching elements may be adjusted to operate in any preferred sequence. The relay employs a keyed oscillator, acting through detector circuitry inductively coupled thereto, to selectively pinch off conduction in a depletion mode field effect transistor which normally maintains an output switching transistor conductive (a "normally closed" relay output). Correspondingly, an independently detected oscillation-responsive output signal initiates conduction in an additional transistor switch included in a normally nonconductive ("normally open") switching channel.

In accordance with one aspect of the invention, diode bridge arrays selectively render the input and output ports insensitive to the polarity of the relay energization or the output load current.

8 Claims, 1 Drawing Figure

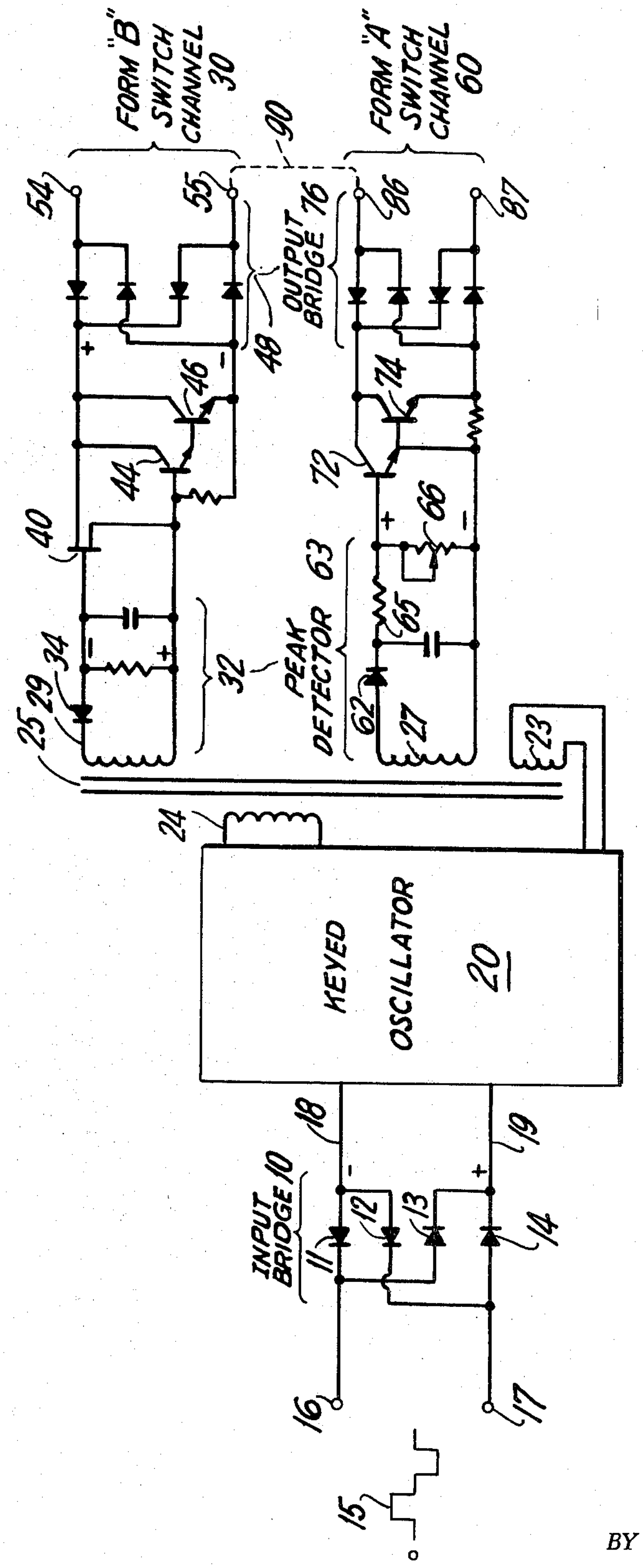
INVENTOR.
NORMAN L. SCHWARTZ
BY
Sandoe, Hopgood & Calimafde
ATTORNEYS

SOLID STATE RELAY

DISCLOSURE OF THE INVENTION

This invention relates to electronic switching apparatus and, more specifically, to a solid state relay for providing any desired output switching configuration which, moreover, is variable as to operative sequence.

Solid state relays have found increasing utility as replacements for their electromechanical counterparts by reason of their extended life, non-inductive input characteristic, speed and small physical size, among numerous other advantageous properties. However, prior art solid state relays have been less than fully flexible to accommodate all desired relay functions. Thus, for example, some prior art devices have employed a common terminal in their control and output switch ports, thereby obviating electrical isolation required therebetween for some relay applications. Also, prior art relays have typically not provided for variable sequencing of plural output switching elements, e.g., such that one element conducts before (or after, or simultaneously with) another element or elements.

It is thus an object of the present invention to provide an improved solid state relay.

More specifically, an object of the present invention is the provision of a solid state relay having electrically isolated control and output ports.

It is another object of the present invention to provide a relay structure, capable of exhibiting any desired switch configuration, the several switch elements being adjustably operable in any desired sequence.

The above and other objects of the present invention are realized in a specific, illustrative solid state relay which includes an input control port for selectively energizing a normally inert keyed oscillator. When actuated, the oscillator generates an alternating potential which is inductively coupled to a plurality of switch channels.

Each normally closed switch channel (or normally closed portion of a form C transfer switch) includes an output transistor switch quiescently maintained conductive by forward base drive flowing through the normally conducting channel of a depletion mode field effect transistor (FET). When the oscillator is keyed, a peak detector circuit produces a voltage which pinches off conduction in the FET, thereby rendering the following switching transistor non-conductive.

Correspondingly, a normally open switch channel (or normally open portion of a form C switch) detects the cyclic oscillator waveform coupled thereto when the relay is actuated. The resulting detector voltage is employed to turn on an associated output transistor switch. The output transistor is nonconductive in the absence of the oscillator keying potential.

In accordance with varying further aspects of my invention, adjustments are provided to sequence action of the several switch channels, and input and/or output diode bridge arrays may be employed to render the relay insensitive to control and/or load signal polarity.

The above-described features and advantages of the present invention are realized in a specific, illustrative embodiment thereof, described in detail in conjunction with the accompanying drawing, which schematically depicts a solid state relay structure illustrating the principles of the invention.

Referring now to the drawing, there is shown a solid state relay comprising a relay actuating input port (terminals 16 and 17); a form B ("normally closed") channel 30 quiescently presenting a low impedance between output terminals 54 and 55 thereof; and a form A ("normally open") channel 60 normally exhibiting a high impedance between output terminals 86 and 87. One form A and one form B switching channel are illustrated for purposes of generality (a form C switch being a combination of these as discussed below). Any number of additional switch channels may be employed as required for any application.

The relay includes a keyed oscillator 20 which is normally passive, and which is actuated when a direct potential of a given polarity, e.g., that shown in the drawing, is applied to input conductors 18 and 19 thereof. The oscillator 20 may be energized by the direct application of a control signal of the proper polarity. Alternatively, to render the relay insensitive to the polarity of the control signal, and as shown in the drawing, a full wave input diode bridge 10, formed of diodes 11–14 is included between the relay input terminals 16 and 17 and the conductors 18 and 19. Thus, applied voltage signals of either polarity, as shown for the input waveform 15, will impress the requisite potential between conductors 18 and 19 to excite the oscillator.

The keyed oscillator 20 may be of any well known construction therefor, e.g., of tickler feedback construction employing an output coil 24 and a feedback coil 23 inductively coupled thereto, the coils 24 and 23 being included in the collector and base-emitter circuits of an oscillator transistor. The voltage on the leads 18 and 19 may comprise the operative oscillator potential, or an oscillator gating potential. The coupling between the windings 24 and 23 is shown as including a ferromagnetic element 25, e.g., a toroidal core.

The switch channels 30 and 60 each include a coil 29 or 27 coupled to the core 25 which have a periodic bipolar potential induced therein when, and only when, the oscillator 20 is energized. The coils 29 and 27 are each connected to a peak detector assembly 32 or 63 for developing a direct output potential, of the polarities shown in the drawing, which depends upon the polarity of an included detector diode 34 or 62. Thus, when the oscillator 20 is active, a negative potential is supplied to the gate of a depletion mode field effect transistor (FET) 40 in the form B channel 30, while a positive potential is supplied across the base-emitter junctions of two transistors 72 and 74, connected in a Darlington configuration, for the form A switch channel 60. When the oscillator 20 is inert, no voltage is developed by either peak detector 32 or 63.

Referring first to the channel 30, the source-drain path of the depletion mode FET 40 normally conducts current, in the absence of any negative gate voltage, from an external potential source applied via the switch terminals 54 and 55 to the base of a Darlington-connected transistor pair 44 and 46. That is, if a positive potential is applied across the transistors 44 and 46 by an external circuit connected to the switch output terminals 54 and 55, either directly in the polarity indicated or via a full wave output bridge 48 for polarity insensitivity, FET 40 will quiescently energize the transistors 44 and 46. The transistors 44 and 46 are thus maintained conductive when the relay is not excited (the oscillator 20 passive), such that a low impedance is presented at the terminals 54 and 55.

When the relay is energized, the oscillator 20 is enabled and supplies output oscillations to the peak detector 32 which thus supplies a negative potential to the FET 40 gate terminal. By conventional internal action for this semiconductor, conduction in the FET 40 is terminated ("pinched off" by operatively interrupting the quiescent resistive conduction channel). Thus, forward gate bias for the transistors 44 and 46 is inhibited rendering these units nonconductive. Accordingly, a high, effectively open circuited impedance is developed at the form B output terminals 54 and 55 when the relay is energized.

It is observed that this "normal closed" state at terminals 54 and 55 is maintained without requiring any gate bias for the FET 40. Also, the Darlington configurations in the channels 30 and 60 are employed to effect a high composite device gain such that the oscillator 20 is not loaded when the relay is energized with a heavy switch loading. High gain single transistors may be employed to a similar effect, and/or the output capacity of the oscillator 20 may be increased to accommodate the contemplated current load.

Turning now to the form A switch channel 60, the transistors 72 and 74 are normally nonconductive in the absence of forward base-emitter drive from the peak detector 63. Thus, a high impedance is normally present between the output terminals 86 and 87.

Conversely, when the relay is energized by the input wave 15, the output of the enabled oscillator 20 is inductively coupled to the peak detector 63. The output of the detector 63 then forward biases the transistors 72 and 74 which thus present a low impedance conduction path between terminals 86 and 87, either for correctly poled external circuit loads or independent of load polarity with the inclusion of a full wave output bridge 76.

Thus, the above discussion has shown that the instant relay is operable to effect the form A and form B switching functions, the transformer coil and core providing d.c. isolation between the relay actuating structure and the switch output ports.

In accordance with one aspect of the present invention, the resistance portions of one (or more) of the peak detectors 32 and 63, e.g., the detector 63, comprises a voltage divider formed of fixed and variable resistances 65 and 66. The value of the resistance 66 controls the conduction delay after oscillator actuation when the transistors 72 and 74 will conduct (i.e., the time when the form A switch closes). In particular, as the resistance of the element 66 becomes smaller, the delay increases for the fixed conduction threshold of the transistors 72 and 74, and vice versa. Thus, the variable resistance 66 may be adjusted such that the form A and form B channels 60 and 30 change state simultaneously; the channel 60 precedes operation of the channel 30 ("make before break"); or channel 60 operation follows that of the channel 30 ("break before make").

Further in this regard, additional switch channels of either type may be included in the composite relay for any given relay application, each such channel having an input control coil coupled to the ferromagnetic core 25. Such additional channels may include voltage dividers corresponding to the elements 65 and 66 for adjustable switch operation sequencing.

Also, one form A and one form B switch channel, e.g., the switch structures 30 and 60 in the drawing, may be combined to form one form C transfer configuration. To this end, one of the terminals 54 or 55 is electrically joined to one of the terminals 86 or 87 to form the common switch terminal, as shown by the dashed conductor 90 in the drawing. As one illustrative application for such a form C configuration, among many others, a bipolar output may be developed across a load connected between the common switch terminal and ground by connecting oppositely poled sources to the remaining two switch terminals.

The above described arrangement is merely illustrative of the principles of the present invention. Numerous modifications and adaptations thereof will be readily apparent to those skilled in the art without departing from the spirit and scope of the present invention.

What is claimed is:

1. In combination in a solid state relay, means for selectively supplying an alternating potential, detector means inductively coupled to said potential supplying means, transistor switch means, a depletion mode field effect transistor having a gate terminal and source and drain terminals having a conduction channel therebetween, said source and drain conduction channel being connected to said transistor switch means, and said field effect transistor gate terminal being connected to said detector means, said detector means thereby controlling the conduction state of said field effect transistor and thereby also said transistor switch means depending upon the presence or absence of an alternating potential from said alternating potential source.

2. A combination as in claim 1, wherein said selective alternating potential supplying means comprises a keyed oscillator including an input control port.

3. A combination as in claim 2, further comprising a full wave bridge connected to said oscillator input control port.

4. A combination as in claim 3 , further comprising additional full wave bridge means connected to said transistor switch means and to said field effect transistor source-drain conduction channel.

5. A combination as in claim 1, wherein said detector means includes voltage divider means for varying the switching response time of said field effect transistor and said transistor switch means.

6. A combination as in claim 2, wherein said transistor switch means comprises normally closed switch means, and further comprising normally open switch means including additional transistor switch means, and additional detector means inductively coupled to said keyed oscillator.

7. A combination as in claim 6, wherein at least one of said detector means includes voltage divider means for varying the relative switching responses of said normally closed and said normally open switch means.

8. A combination as in claim 7, further comprising means interconnecting said normally open and said normally closed switch means for forming transfer switch means.

* * * * *